United States Patent
Pernull et al.

(10) Patent No.: US 10,707,888 B2
(45) Date of Patent: Jul. 7, 2020

(54) METHOD AND APPARATUS FOR ANALOG/DIGITAL CONVERSION

(71) Applicant: Infineon Technologies AG, Neubiberg (DE)

(72) Inventors: Martin Pernull, Villach (AT); Peter Bogner, Wernberg (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/386,669

(22) Filed: Apr. 17, 2019

(65) Prior Publication Data

US 2019/0326919 A1   Oct. 24, 2019

(30) Foreign Application Priority Data

Apr. 19, 2018 (DE) .................. 10 2018 109 335

(51) Int. Cl.
*H03M 1/10* (2006.01)

(52) U.S. Cl.
CPC ....... *H03M 1/1009* (2013.01); *H03M 1/1071* (2013.01)

(58) Field of Classification Search
CPC .. H03M 1/1009; H03M 1/1071; H03M 1/125; H03M 1/468
USPC ......................................... 341/120, 144, 155
See application file for complete search history.

(56) References Cited

U.S. PATENT DOCUMENTS

| | | | |
|---|---|---|---|
| 9,614,540 B1 | 4/2017 | Kull et al. | |
| 9,667,268 B2* | 5/2017 | Girardi | H03M 1/001 |
| 10,187,079 B1* | 1/2019 | Sharif | H03M 1/38 |
| 10,483,995 B1* | 11/2019 | Lok | H03M 1/468 |
| 10,505,559 B1* | 12/2019 | Chao | H03M 1/0612 |
| 2012/0032824 A1 | 2/2012 | Yoshioka | |
| 2012/0268185 A1 | 10/2012 | Kapusta | |
| 2014/0184436 A1 | 7/2014 | Lee et al. | |

\* cited by examiner

*Primary Examiner* — Brian K Young
(74) *Attorney, Agent, or Firm* — Slater Matsil, LLP (57) ABSTRACT

A method and an apparatus for determining the suitability of a test delay value between comparator decisions of a comparator circuit of an asynchronous successive approximation analog/digital converter and a method for determining an optimized delay value of a comparator of an asynchronous successive approximation analog/digital converter are provided.

20 Claims, 4 Drawing Sheets

METHOD AND APPARATUS FOR ANALOG/DIGITAL CONVERSION

This application claims the benefit of German Application No. 102018109335.7, filed on Apr. 19, 2018, which application is hereby incorporated herein by reference in its entirety.

TECHNICAL FIELD

This disclosure generally relates to methods and apparatuses for analog/digital conversion.

BACKGROUND

Asynchronous successive approximation analog/digital converters (SAR-ADCs, successive approximation register analog-digital converters) convert analog input signals into digital output signals.

For this purpose, an analog input signal is compared with the output of a digital/analog converter, in which case the output of the digital/analog converter is successively adapted in a search process on the basis of comparator decisions. The comparator and an approximation register, which provides the digital/analog converter with the values, are usually clocked by a synchronous source. The digital/analog converter must have sufficiently settled in each clock period, that is to say voltages and the like must have at least approximately settled to steady-state values, and the decision of the comparator must be made. In the case of low differential input signals at the comparator, comparator decisions may need a longer time than in the case of large differential input signals. It must therefore be ensured that a sufficiently long time is available for the comparator decisions in order to obtain correct results of the analog/digital conversion. In asynchronous SAR analog/digital converters, there is no external clock signal for the above search process. A circuit detects decisions of the comparator and generates a new clock pulse for controlling a next decision after a predefined delay time. On average, this allows the comparator to be operated at a higher speed since the clocking is based on an actually required time for the comparator decision and need not be selected, as in the case of fixed (synchronous) clocking, in such a manner that a longest possible decision time is covered.

A challenge may lie in determining a suitable delay between a comparator decision and the generation of the next comparator clock pulse. The delay must be long enough to provide the digital/analog converter with sufficient time for settling after a changeover operation. On the other hand, a low delay value allows a longer period for longer comparator decisions with the same total duration of a run of the search process.

SUMMARY

One exemplary embodiment provides a method for determining the suitability of a test delay value between comparator decisions of a comparator circuit of an asynchronous successive approximation analog/digital converter, wherein the method comprises the following steps of: providing the test delay value, converting a predetermined digital test value into an analog test signal by means of the digital/analog converter, approximating the analog test signal in a bit-by-bit manner by means of the asynchronous successive approximation analog/digital converter, thus generating a digital test result, and determining whether the test delay value is a suitable delay value for operating the asynchronous successive approximation analog/digital converter on the basis of a comparison of the digital test result with the predetermined digital test value.

A further exemplary embodiment provides a method for determining an optimized delay value of a comparator for a bit of an asynchronous successive approximation analog/digital converter. In this case, the method comprises carrying out the method described above for at least two different test delay values, and determining the optimized delay value on the basis of a comparison of the at least two results of the process of determining whether the test delay value is a suitable delay value for operating the analog/digital converter.

Another exemplary embodiment provides an apparatus for analog/digital conversion. This apparatus comprises a digital/analog converter, a comparator circuit, a delay circuit and a time calibration circuit. The time calibration circuit is set up to carry out one of the methods described above.

A further exemplary embodiment provides an apparatus for analog/digital conversion. This apparatus comprises an asynchronous successive approximation analog/digital converter. The latter comprises a digital/analog converter, an approximation register, a comparator circuit, and an adjustable delay circuit which is set up to stipulate a delay between decisions of the comparator circuit. The apparatus also comprises a time calibration circuit. The latter is set up to set the delay of the adjustable delay circuit.

DETAILED DESCRIPTION OF ILLUSTRATIVE EMBODIMENTS

Different exemplary embodiments are described in detail below with reference to the accompanying drawings. These exemplary embodiments should be considered merely as an example and should not be interpreted as restrictive. For example, some of the features or components described may be omitted and/or replaced with alternative features or components in other exemplary embodiments. Features or components of different exemplary embodiments may be combined in order to form further exemplary embodiments. Variations and modifications which are described with respect to one exemplary embodiment can also be applied to other exemplary embodiments. Furthermore, features or components other than those described or shown may have been provided, for example features or components used in conventional analog/digital converter circuits.

Direct connections or couplings shown in the drawings or described below, that is to say electrical connections or couplings without intermediate elements (for example simple metal conductor tracks), can also be implemented by means of an indirect connection or coupling, that is to say a connection or coupling which comprises one or more additional intermediate elements, and vice versa, as long as the general method of operation of the connection or coupling, for example provision of a voltage, provision of a current, conduction of an electromagnetic wave or provision of a control signal, is substantially retained.

In the figures, identical reference signs denote identical or similar elements. The figures are schematic representations of different exemplary embodiments. Elements illustrated in the figures are not necessarily illustrated true to scale. Rather, the various elements illustrated in the figures are represented in such a manner that their function and general purpose are comprehensible to a person skilled in the art.

Numerical values mentioned in connection with exemplary embodiments, for example in connection with simulation curves, are used only for explanation. Numerical values and profile shapes of curves should not be interpreted as restrictive and depend on the choice of the parameters.

Figure 1A:
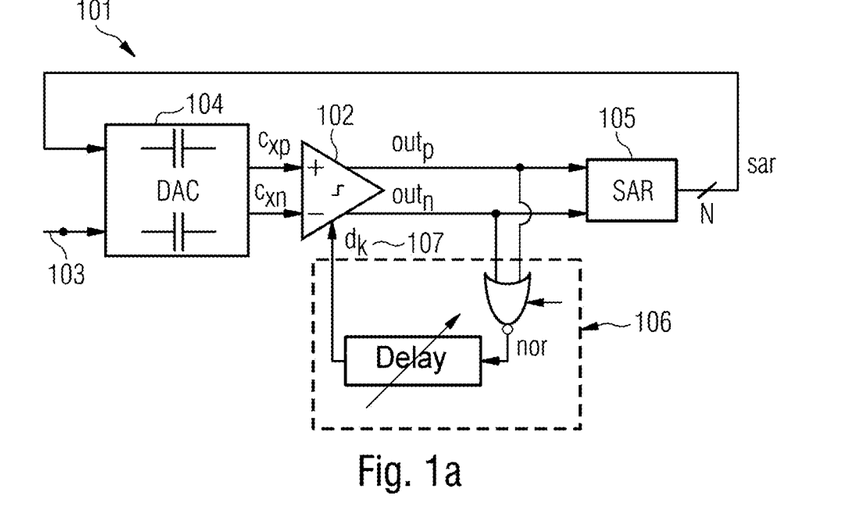
FIGS. 1a and 1b show an apparatus for analog/digital conversion as a basis for exemplary embodiments.
Figure 1B:
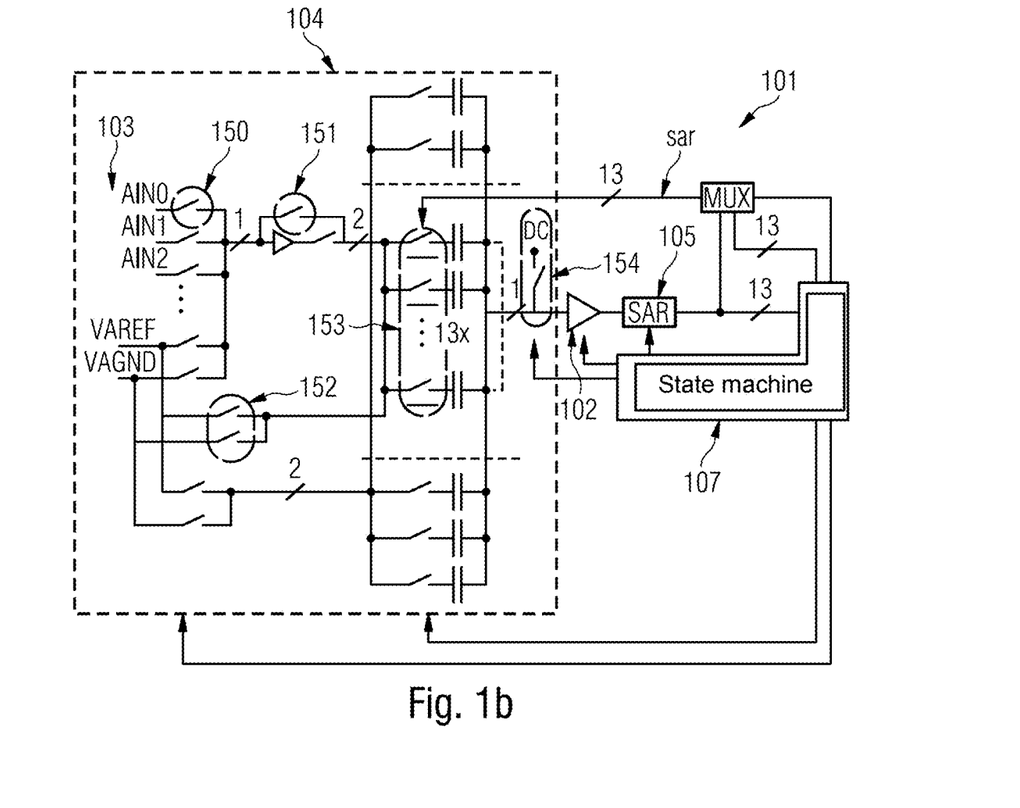

FIGS. 1a and 1b show an apparatus for analog/digital conversion as a basis for exemplary embodiments.

FIGS. 1a and 1b show an analog/digital converter in the form of an SAR converter. The apparatus for analog/digital conversion 101 is set up to compare an analog input signal 103, which may be present in differential form, as shown in FIG. 1a, or with respect to a reference potential, as shown in FIG. 1b, with an output signal from a digital/analog converter 104 by means of a comparator circuit 102. In exemplary embodiments in which the digital/analog converter 104 is in the form of a capacitive arrangement, this step is referred to as redistribution or a redistribution phase of the analog/digital converter, and the step in which the capacitive arrangement is connected to the analog input signal is referred to as sampling or a sampling phase of the analog/digital converter.

In some embodiments, the digital/analog converter 104 is set up to likewise provide the analog input signal 103 for the comparison with the digital/analog converter value. This is schematically shown in FIG. 1b: the digital/analog converter 104 has a multiplicity of switches 150, 151, 152, 153, 154 which make it possible for the digital/analog converter 104 to be operated in two operating modes. In a first operating mode, the switches 150,151 and 154 are closed, with the result that the digital/analog converter operates like a sample-and-hold circuit. In a second operating mode, the switches 150, 151, 154 are open and the switches 152 are closed and the switches 153 are each open or closed such that an analog voltage corresponding to the setting of the approximation 105 is made available to the comparator 102. Other implementations of the comparison with the analog input signal 103 are also possible, as schematically indicated using the dashed line.

In the example shown in FIG. 1b, the digital/analog converter 104 may be in the form of a capacitive digital/analog converter. In these examples, the input voltage 103 is made available to the comparator 102 via the capacitive digital/analog converter 104. The charging/charge reversal of the capacitances of the digital/analog converter requires a finite time which is referred to as the settling time. Therefore, it is necessary to wait for this settling time before a comparator decision so that the voltage from the digital/analog converter that is applied to the comparator corresponds to the approximation register value which has been set with sufficient accuracy. Even though the settling time has been described here on the basis of a capacitive digital/analog converter, there are similar physical properties in other implementations which likewise result in a settling response of the digital/analog converters and can necessitate time delays, as can be provided by a delay circuit 106, between comparator decisions.

The result of the comparison of the analog input signal 103 and the digital/analog converter value is forwarded to an approximation register 105 which is used for the successive approximation by a controller 107. The comparator 102 respectively generates a signal in the case of a positive and a negative decision. These signals are combined by means of a NOR gate: in the case of a decision by the comparator circuit 102, an edge change from 1 to 0 therefore takes place at the output of the NOR gate. This edge change is delayed by a delay circuit 106 and then acts as the clock pulse for the next run at the comparator circuit 102. During the available time which is available on account of the delay value of the delay circuit 106, a digital value is changed in the approximation register 105 on the basis of the comparator decision. This digital value is transmitted to the digital/analog converter 104. The digital/analog converter 104 provides the comparator 102 with a new analog signal on the basis of the digital value transmitted by the approximation register 105. In response to the clock pulse, the method can now be successively repeated until the analog input signal 103 has been determined with sufficient accuracy, that is to say the value in the approximation register 105 corresponds to the analog input signal.

The comparator circuit 102 and the approximation register 105 are usually clocked synchronously in this case. For the function of the apparatus for analog/digital conversion, it is important that the digital/analog converter 104 settles sufficiently during each clock period before the comparator decision is made. For this purpose, the delay circuit 106 provides a corresponding delay. In the example shown in FIG. 1, there is no external clocking for the approximation register 105, but rather a separate clock signal is generated, as described above. As a result, the corresponding time is available for each decision. Exemplary embodiments discussed in more detail below provide techniques for setting the delay of the delay circuit 106.

Exemplary embodiments are first of all explained below on the basis of FIGS. 2, 3 and 4.

Figure 2:
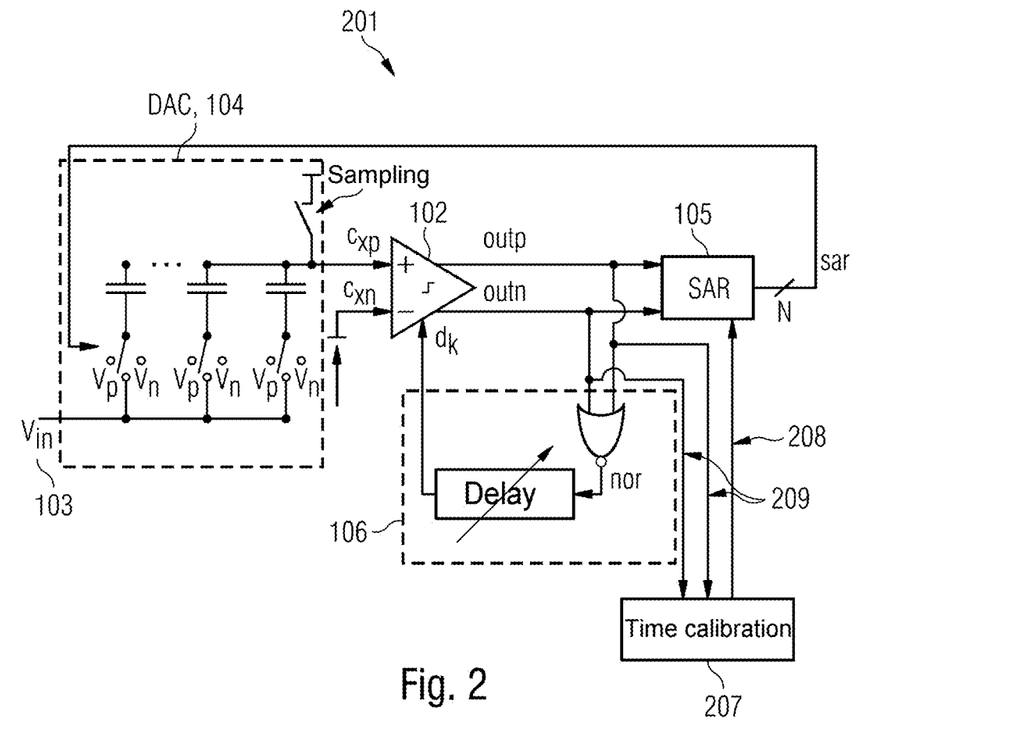
FIG. 2 shows an apparatus for analog/digital conversion according to different exemplary embodiments.

FIG. 2 shows an apparatus for analog/digital conversion according to different exemplary embodiments.

The apparatus for analog/digital conversion 201 shown in FIG. 2 is based on the apparatus for analog/digital conversion 101 shown in FIG. 1. Mutually corresponding assemblies are marked by identical reference signs. The apparatus for analog/digital conversion 201 additionally has a time calibration circuit 207 which is coupled to the comparator 102 via a coupling 209 and to the approximation register 105 via a coupling 208. A method for determining the suitability of a test delay value according to FIG. 3 can be carried out by the apparatus for analog/digital conversion 201 using the time calibration circuit 207.

The methods described above and below can also be stored, for control by means of a computer, as instructions on a materially present storage medium, for example as instructions for the time calibration circuit 207. The time calibration circuit can be implemented on a PC comprising a memory and a processor, but can also be implemented as hard-wired logic, an ASIC or another embodiment.

Figure 3:
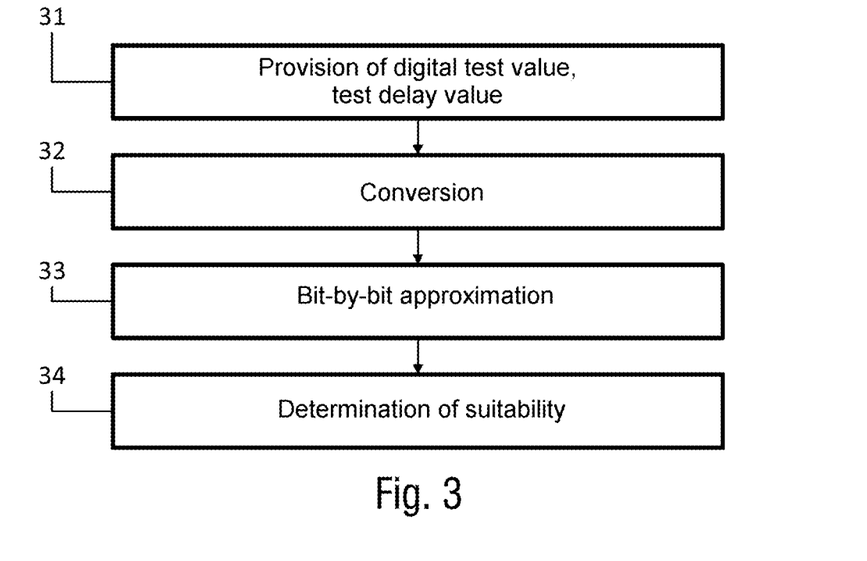
FIG. 3 shows a flowchart of a method according to different exemplary embodiments.

FIG. 3 shows a flowchart of a method according to different exemplary embodiments.

By means of the method shown in FIG. 3, it may be possible to determine the suitability of a test delay value tDAC of a comparator for an asynchronous successive approximation analog/digital converter. One advantage of this procedure may be that the test delay value tDAC is determined under the same conditions as are also present during operation for the analog/digital conversion of an unknown analog signal. This may have the advantage that the behavior of the test delay values tDAC can correspond as accurately as possible to the delay values during the analog/digital conversion of an unknown signal.

In this case, suitability of a test delay value tDAC should be understood as meaning, in particular, the fact that the test delay value is selected in such a manner that the test delay value is sufficiently long so that the result of the SAR analog/digital conversion meets a predefined quality requirement. This quality requirement may be, for example, the fact that the digitally predefined signal is determined with the accuracy of the least significant bit (LSB) as the result of the digital/analog converter analog/digital converter process, but other accuracy requirements are also possible. In the case of SAR analog/digital converters having a redundant design, a certain amount of wrong decisions can also be tolerated on account of the redundancy, with the result that shorter values for tDAC can be determined as suitable than is the case in arrangements which are designed without redundancy.

One advantage of the method may be in this case that the properties determined in this manner for test delay values tDAC are representative of the actual use in the case of unknown analog signals since the operation of the apparatuses during calibration operation corresponds substantially to the operation during subsequent normal operation for converting an unknown analog signal. In some exemplary embodiments, accurate calibration of the delay may thus be possible. In this case, it may be possible, in some exemplary embodiments, to select tDAC to be as short as possible, for example still exactly within the tolerance range in the case of a design with redundancy, or precisely such that, in exemplary embodiments without redundancy, settling can be concluded, as a result of which, in some exemplary embodiments, fast conversion is possible, but it is nevertheless ensured that the conversion provides correct results.

The method can be carried out, for example, by the apparatus for analog/digital conversion 201.

In 31, the digital/analog converter is provided with a predetermined digital test value for this purpose. In some exemplary embodiments, the digital/analog converter is in the form of a capacitive arrangement (capacitor array), as is shown in FIG. 2, for example. SAR converters having a capacitive arrangement can be operated using two operating modes, a sampling phase in which the capacitive arrangement can be used as a buffer for an analog input signal, and a redistribution phase in which the output voltage of the capacitive arrangement can be modified by changing over the couplings of the capacitances in the arrangement. In such exemplary embodiments, the digital test value can be provided in the sampling phase and the method can be started by means of a clock pulse. In other exemplary embodiments which likewise use a capacitive arrangement, the provision can also be effected in the redistribution phase, in which case, in these exemplary embodiments, the method begins only with a second clock signal.

One possible procedure for selecting test delay values tDAC is explained in more detail below. In some exemplary embodiments, the method is carried out for a value tDAC for all bits of the SAR converter. In this case, all bits of the SAR converter denote all N bits of an SAR converter having N bit stages, for example 14 stages in the case of a 14-bit SAR converter without redundancy. In the case of SAR converters with redundancy, the number of stages may be higher than the bit resolution of the SAR-ADC, for example may comprise 16 internal bits in the case of a redundant SAR converter which provides a signal digitized with 14 bits. In such exemplary embodiments, the number of internal bits determines the number of approximations to be carried out in a bit-by-bit manner.

In some exemplary embodiments of the method, tDAC is different for each bit. In such exemplary embodiments, tDAC may denote a set of respective delay values for respective bits. For example, it is thus possible for tDAC to be composed of delay values tDAC-MSB, tDAC-MSB+1, . . . tDAC-LSB for the different bits of the SAR converter, with the result that tDAC-LSB may be shorter than tDAC-MSB+1, for example. In this case, MSB denotes the most significant bit.

In some exemplary embodiments, the digital test value can be provided by passing the test value 208 to the approximation register 105, whereupon the setting is made at the digital/analog converter 104, as described above and below.

In 32, the test value 208 is converted into an analog test signal, for example by means of the digital/analog converter 104. In this case, in some exemplary embodiments, the digital/analog converter 104 can be set directly. This can be carried out, for example, by directly controlling the switches 153, for example by means of an additional control line (not shown).

In other exemplary embodiments, as shown in FIG. 2, the test value 208 can be written to the SAR register 105 and can be used to set the switches in the digital/analog converter 104. This variant is schematically indicated in FIG. 2 with the arrow SAR. In this case, it is possible for the digital/analog converter to be set to an initial configuration before the test value is set. In some exemplary embodiments, the initial configuration can be selected in such a manner that all switches couple the capacitances in the digital/analog converter 104 to the negative supply voltage vn. In other exemplary embodiments, all switches can couple the capacitances in the digital/analog converter 104 to the positive supply voltage vp. In further exemplary embodiments, some switches can couple the respective capacitance to the negative supply voltage vn and other switches can couple the respective capacitances to the positive supply voltage vp.

Such different initial configurations may have the advantage that the respective time constants for reversing the charge of the capacitors can be influenced by the polarity of the charging/discharging cycle. If, for example, all capacitors are initially coupled to vp, the respective charge reversal of the capacitors must be carried out from positive to negative. If the capacitors are initially coupled to vn, the respective charge reversal must be carried out from negative to positive. In some exemplary embodiments, there may be an asymmetry of the time constants for reversing the charge from positive (vp) to negative (vn) and from negative (vn) to positive (vp). This can be taken into account or used by the choice of the initial configuration. It may also be possible to determine the behavior of the circuit for different initial configurations, for example in different operating conditions. In some exemplary embodiments, the analog test signal is made available to a comparator circuit, for example to the comparator circuit 102, by the digital/analog converter 104.

In 33, a digitized comparison result of the comparator circuit 102 is generated on the basis of the test delay value tDAC and the analog test signal by means of approximation in a bit-by-bit manner. This may mean that the respective time at which the comparator circuit 102 carries out the respective comparison for the respective bit depends on the test delay value tDAC. This respective delay can be carried out by the delay circuit 106, for example. In some exemplary embodiments with a test delay value tDAC, the respective delay may be the same for all bits. In other exemplary embodiments, the respective delay may be different for the respective bit, as described above. In some exemplary embodiments, no test delay value tDAC is used during the bit-by-bit approximation of the most significant bit. In these exemplary embodiments, the method is used for the remaining bits. In some exemplary embodiments, the method is used only for some of the bits of the SAR converter.

In 34, it is determined whether the test delay value tDAC is a suitable delay value for operating the analog/digital converter on the basis of the digitized comparison result with the digital test value. In this case, it is possible to compare how accurately a predefined digital test value corresponds to the result of the successive approximation digital/analog conversion method. For example, if the digitized comparison result corresponds exactly to the digital test value, it can be determined that the test delay value tDAC is suitable. In other exemplary embodiments, a suitability can be determined, for example, if the result is accurate, apart from the LSB. In other exemplary embodiments, a tolerance, which is specified as a percentage of the digital test value or as a percentage of the full dynamic range of the analog/digital converter, can be used as a criterion for determining the suitability. For example, a suitability can be determined if the difference is less than 20%, for example less than 5%, for example less than 1%, for example less than 0.1%. The digital comparison result can be received by the time calibration circuit 207 in the apparatus for analog/digital conversion from FIG. 2, for example via the coupling 209.

A further method according to different exemplary embodiments is explained below on the basis of the flowchart shown in FIG. 4.

Figure 4:
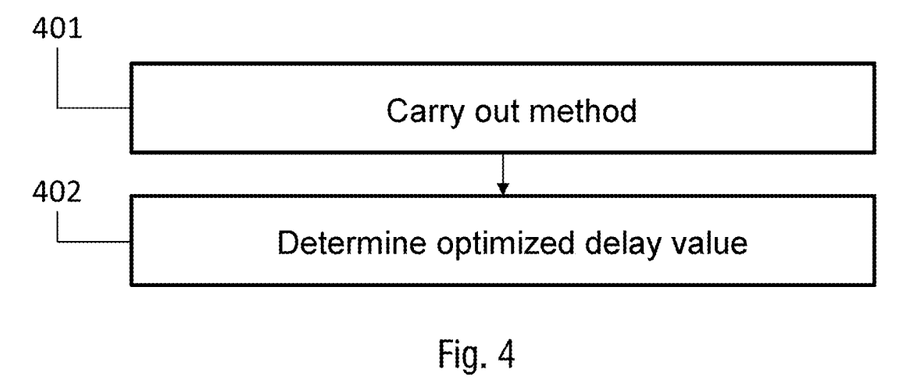
FIG. 4 shows a flowchart according to different exemplary embodiments.

By means of the method shown in FIG. 4, it may be possible to determine an optimized delay value of a comparator for a predefined bit of an asynchronous successive approximation analog/digital converter.

In step 401, a method as described above on the basis of FIG. 3 is carried out for at least two different test delay values. In step 402, the optimized delay value is determined on the basis of a comparison of the at least two results of the determination of whether the test delay value tDAC is a suitable delay value for operating the analog/digital converter.

In this case, in some exemplary embodiments, the at least two test delay values tDAC can be generated successively and in a monotonously increasing manner. In some exemplary embodiments, the method may comprise a termination condition, wherein the termination condition is satisfied as soon as the determination determines a suitability. In this case, the test delay value which resulted in the termination condition being achieved, that is to say is a suitable delay value, can be determined as the optimized delay value. In the exemplary embodiments having a plurality of test delay values for different bits, the method can accordingly be carried out in a bit-by-bit manner by respectively determining a set of optimized delay values for each bit or for some of the bits, for example.

For example, in some exemplary embodiments, the test delay value tDAC0 can be initially set to 0 for a particular bit. If the method arrives at the result that tDAC0 is not a suitable delay value, tDAC1=tDAC0+Δt is formed and the method is repeated until tDACn is determined to be suitable. In this case, Δt is a predefined time step. tDACn is then determined as a suitable delay value and the method is terminated.

In some exemplary embodiments, this can have the advantage that a shortest possible delay value tDAC, which still provides a correct digitization result for the respective bit and can therefore ensure both reliable and fast operation of the analog/digital converter, is determined for the respective bit. It may also be possible to dispense with additional calibration structures, as a result of which it may be possible to keep the area requirement of the apparatus low and/or to keep the power consumption of the apparatus low.

In some exemplary embodiments, the method may also comprise a procedure in which at least two test delay values are generated successively during an interval interleaving method in which the optimized delay value is determined. In some exemplary embodiments, the interval interleaving method may comprise methods which correspond to a binary search or have elements of a binary search.

For example, the method can first of all be run through with a very short test delay value tDAC0 and a long test delay value tDAC1. If the method does not determine a suitability, tDAC1 is increased further. If the method determines a suitability of tDAC0, tDAC0 is reduced further. As soon as the method determines a suitability of tDAC1 and no suitability of tDAC0, the interval (tDAC0; tDAC1) is defined as the search interval and a new test delay value tDAC2 is formed as the mean value of tDAC1 and tDAC0. If the method determines a suitability of tDAC2, the new search interval is determined as (tDAC0; tDAC2). If, in contrast, the method does not determine a suitability of tDAC2, the new search interval is determined as (tDAC2; tDAC1). The search is now continued with the new search interval. In the example mentioned, the interval was halved, but other divisions are also possible, for example division of the search range into three, four or more sub-intervals.

This may have the advantage that the optimized delay value is quickly determined.

In some exemplary embodiments, it is taken into account whether the digital/analog converter has a redundancy area. This is explained below with reference to the exemplary embodiments shown in FIGS. 5 and 6.

Figure 5:
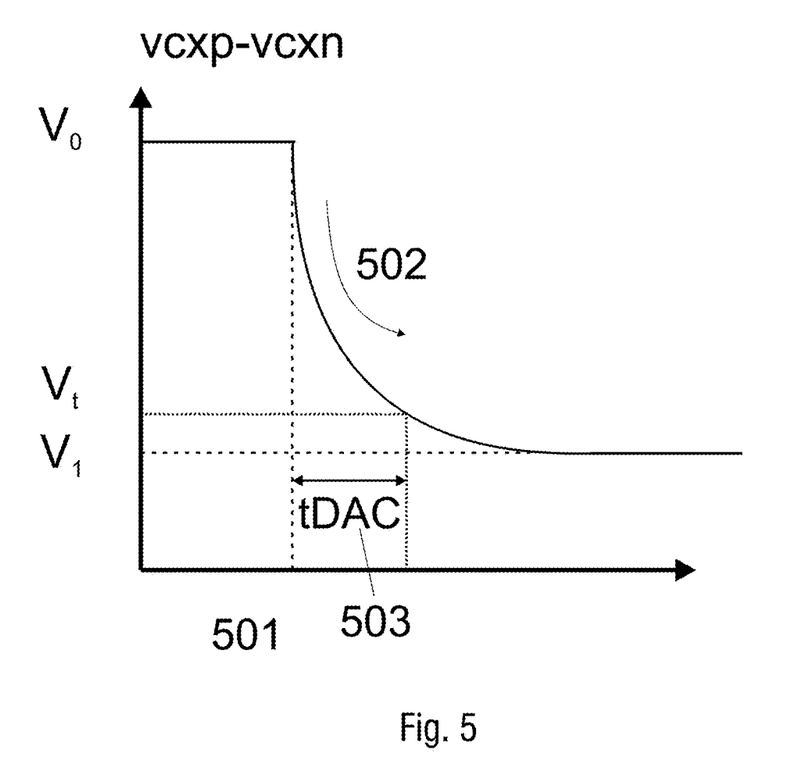
FIG. 5 shows a temporal profile of a differential output of a digital/analog converter according to different exemplary embodiments.

FIG. 5 shows a temporal profile of a differential output of a digital/analog converter according to different exemplary embodiments.

In the SAR process, the bits are determined in order. In the example shown in FIG. 5, a bit decision for a preceding bit is made at the time 501. This may be, for example, the decision for the MSB, but may also be for another bit, with the exception of the LSB. After the decision, the controller instructs the digital/analog converter to change the digital/analog converter output signal from V0 to V1 in order to run through the SAR process for the current bit and carry out a comparison according to the method between the register value and the analog signal. This is explained in more detail further below in connection with FIGS. 6 and 7. On account of limiting factors which have already been described above and may also exist, for example, in the output resistances of the buffer, resistances of the lines and switches, capacitive loads and parasitic capacitances, this is not carried out instantaneously, but rather the digital/analog converter output signal exhibits a temporal profile 502 which is illustrated as an exponential drop in FIG. 5. This process is also referred to as the settling process. If the analog/digital converter is a binary analog/digital converter without a redundancy area, it is necessary for the delay value tDAC to be long enough for the curve 502 to have fallen to the level V1 before a comparator decision is made. The variation in the delay value tDAC according to the method described above may have the effect of more or less time being available for the settling process, in which case the output level V0, which constitutes an influencing variable for the temporal profile 502 of the settling process, can be influenced by the previous bit decision and/or by the choice of test value. It may therefore be possible to determine, on the basis of a comparison of the digital test result with the predetermined digital test value, whether the test delay value tDAC is a suitable delay value for operating the asynchronous successive approximation analog/digital converter.

In some exemplary embodiments, the analog/digital converter has redundancy. This means that more bits are available for the successive approximation than the desired bit resolution of the output signal from the analog/digital converter. The weighting/assessment of the bits is not binary (for example 1:2:4:8 . . . ) in this case but rather lower (for example 1:1.8:3.24:5.832, in some exemplary embodiments with additional standardization), with the result that there are a plurality of possible ways of representing a value by means of a bit string. This results in a wrong decision for a bit still being able to be compensated for by subsequent decisions for the subsequent bits. In the case of exemplary embodiments having an analog/digital converter which has a redundant design and has a redundancy window Vt, it suffices for tDAC 503 to be shorter, with the result that the curve 502 must fall only to a value Vt which results from the size of the redundancy window. This time for a redundant digital/analog converter is shown as an example in FIG. 5.

As described above, it is possible to search for a suitable value for tDAC in various ways. For example, it is possible to begin the search method with a shortest possible value of tDAC and to increase the value by a time step $\Delta t$ until a suitable value has been found for tDAC. An interval interleaving method can also be used, as described above.

In some exemplary embodiments, the method according to FIGS. 3 and 4 takes into account redundancy areas of the asynchronous successive approximation analog/digital converter during the comparison.

In some exemplary embodiments, this may mean that wrong decisions for individual bits may be acceptable on account of the redundancy since they can be compensated for in further digitization steps.

Figure 6:
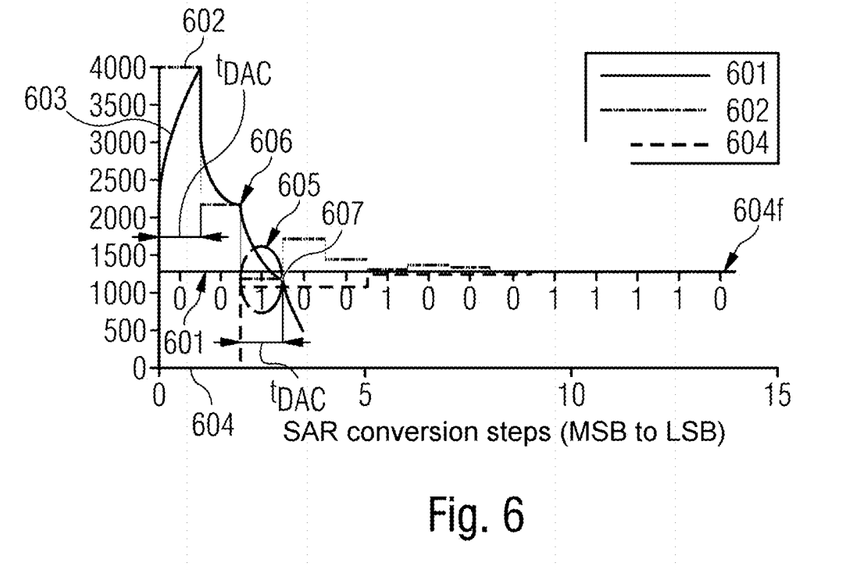
FIG. 6 shows a temporal profile of a differential output of a digital/analog converter according to different exemplary embodiments without a redundancy window.

One example according to different embodiments is shown in FIG. 6.

According to the exemplary embodiment, a delay value for the third bit, which is two bits after the most significant bit (MSB), is tested.

The curve 602 shows the predefined comparison values of the algorithms for testing whether or not a bit is intended to be set. In this case, the curve 602 corresponds to the digital value set in the approximation register. A curve 603 shows the temporal profile of the actual voltage at the comparator input, which voltage corresponds to the output of the digital/analog converter. Like the exemplary curve in FIG. 5, the curve 603 describes an exponential profile with respect to the value 602 which has been set. The approximation method can be discerned from the stages of the curve 602 which makes it necessary for the voltage 603 of the digital/analog converter to settle for each bit. The first step S1 tests whether the MSB must be set to 1 or 0. For this purpose, the MSB is set to i in the approximation register. The digital/analog converter settles to the value which has been set. If tDAC has been selected to be sufficiently long, the digitized comparison result 604f at the end of the bit-by-bit approximation in the SAR method is correct. In this case, the curve 604 shows the temporal profile of the bit-by-bit approximation. The end result of the bit-by-bit approximation is the digitized comparison result 604f. tDAC for the third bit 605 must be sufficiently long so that the curve 603, starting from point 606, has sufficient time to fall to the value 607 so that the comparator decision for the third bit is correct. It can also be seen from the profile of the curve 602 that it may be necessary to set high voltage differences of the digital/analog converter between individual bits. This may result in different delay values being able to be suitable for different bits.

Comparing the digitized comparison result 604f with the predefined value 601 makes it possible to determine whether tDAC has been suitably selected. In exemplary embodiments without a redundancy window, it is possible to determine in this case whether tDAC has been suitably selected for individual bits. In exemplary embodiments with a redundancy window, it is possible to determine in this case whether tDAC has been suitably selected for all bits, which means that the digitized comparison result 604f has less than a predefined permitted deviation from the predefined value 601. In further exemplary embodiments, it may also be possible, if redundancy is present, to determine one or more bits for which a wrong decision has been made and has been compensated for by the subsequent bits, on the basis of prior knowledge relating to the design of the redundancy even in cases in which the comparison result 604f corresponds to the predefined value 601. The variation in the value of tDAC from run to run may then likewise be varied, as described above, for example by increasing tDAC by a time step $\Delta t$, by means of an interval interleaving method or by means of other methods.

The predefined value 601 can be selected in various ways. In some exemplary embodiments without a redundancy window, the predefined value 601 can be selected, for example, in order to test a decision for a particular bit. For example, a value of 2^8 can be selected in order to test the eighth bit. In some exemplary embodiments, the predefined value 601 can be randomly selected. In other exemplary embodiments, the predefined value 601 can be selected from a list of test values which cover the entire dynamic range or a part of the dynamic range of the analog/digital converter. In yet other exemplary embodiments, the predefined value 601 can take into account a redundancy window, that is to say can be selected as 2^8 for the eighth bit, for example, but reduced or increased by the redundancy window. In some exemplary embodiments, the value can be additionally modified by tolerance ranges which can be selected, for example, as a percentage of the dynamic range or of the redundancy window.

Figure 7:
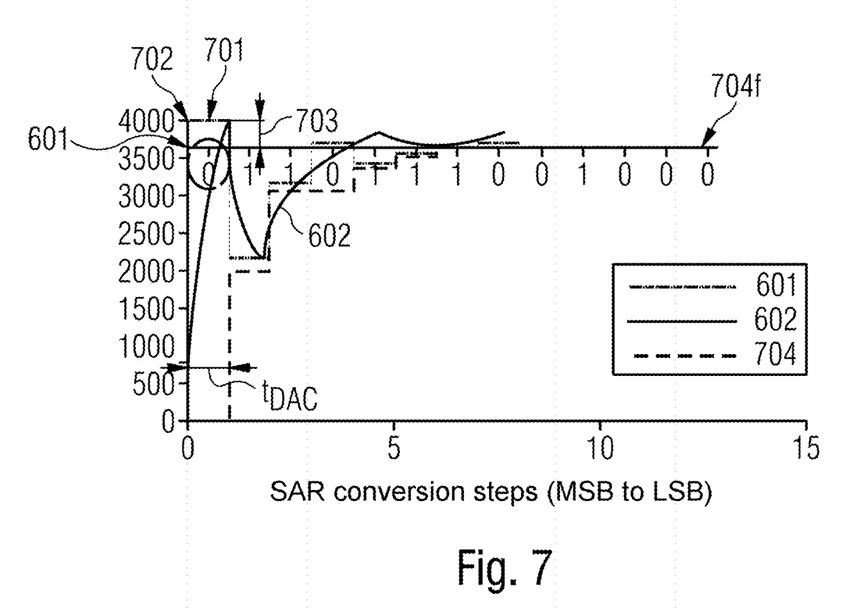
FIG. 7 shows an exemplary embodiment for a run of the method when a redundancy window is present.

One exemplary embodiment for a run of the method when a redundancy window is present is shown in FIG. 7 as an example. Conventional redundancy windows are selected in the range of 30% of the full dynamic range (full scale), in the range of 14-30% in some exemplary embodiments and in the range of 10-15% in other examples, in which case other ranges are also possible. In the example shown, the time calibration is carried out on the basis of the MSB for the bit following the MSB. However, the method can also be used for other bits, in which case the influence of previous bit decisions must be concomitantly taken into account for subsequent bits. A consideration can be achieved by selecting the predefined value 601, for example by taking into account the redundancy window, as described above. On account of the redundancy, it is not necessary for the voltage at the comparator input 602 to correspond exactly to the predefined value 601. It suffices if tDAC has been selected in such a manner that the settling process approaches the predefined value for the MSB 702 within the time available for the settling on account of tDAC, apart from the redundancy window 703. In this case, the bit decision is correctly made.

If tDAC were too short, the MSB would be set. If tDAC were likewise too short for the further comparator decisions and/or the redundancy window were not sufficiently large to compensate for the wrong decision for the MSB, the determined value at the end of the bit-by-bit approximation 704, which corresponds to the digitized comparison result 704f of the bit-by-bit approximation, would not correspond to the predefined digital test value 601. In some exemplary embodiments, it may be possible in this case for a correspondence to be determined even when the digitized comparison result 704f corresponds substantially to the predefined test value 601, for example except for 10%, for example except for 5%, for example except for 1%, for example except for 0.1%, of the dynamic range of the analog/digital converter. In such cases, tDAC can be varied as described above until a suitable and/or optimum value is determined for tDAC, for example by means of interval interleaving or an incremental increase of tDAC by +Δt. However, if tDAC is long enough, as shown as an example in FIG. 7, the digitized comparison result 704f of the successive approximation process 704 at the end of the SAR method is correct. In these cases, it may therefore be possible, according to the methods in accordance with exemplary embodiments, to determine a shorter value for tDAC which, despite the shorter time, provides correct values on account of the redundancy since the decision is within the redundancy window, with the result that the analog/digital conversion can take place more quickly.

In some exemplary embodiments with redundancy windows, the last bit may not have any redundancy. In these examples, the method without redundancy should accordingly be used for the LSB.

In some exemplary embodiments, the method can determine optimized delay values for at least two different bits. For example, it is possible to first of all determine which value for tDAC for the MSB results in correct digital conversion of the predefined input signal and then which value tDAC' is acceptable for the bit following the MSB. In particular, this method can be run through for all bits in some exemplary embodiments. This may have the advantage that the optimized delay values can be compared for all bits.

On the basis of the results, a global delay value can be determined as the maximum of the various optimized delay values. That is to say, tDAC in the above example, if it is longer than tDAC', or vice versa in the other case. In cases in which optimized delay values have been determined for all bits, this may have the advantage that the maximum can ensure that sufficient time for settling of the comparator is ensured for all bits and only one delay value must therefore be used during operation.

In some other exemplary embodiments, a suitable delay value, in some exemplary embodiments the shortest possible delay value, can be determined in groups for a plurality of bits or individually for each individual bit, for example tDAC1 for the MSB, tDAC2 for the bit following the MSB etc. Alternatively, groups of bits may be formed, in which case the minimum required value tDAC is respectively determined for each group. In some exemplary embodiments, this may have the advantage that bits can be grouped according to their required delay time and fewer different delay times than bits for digitization have to be provided.

In some exemplary embodiments of the apparatus for analog/digital conversion, the delay circuit 106 has at least two different time delays and is set up to provide these in response to a comparator decision. In some exemplary embodiments, this may have the advantage that a different time delay can be selected for the MSB, for example, than for the subsequent bits. In some embodiments, an associated delay value can also be selected for each individual bit.

This may have the advantage that the speed of the analog/digital conversion can be increased in comparison with apparatuses for analog/digital conversion having a single time delay. If, for example in an exemplary embodiment, it is necessary to wait twice as long for the settling of the digital/analog converter for the MSB than for the subsequent bits, the time delay required for the MSB must be selected for all bits in exemplary embodiments having a time delay. If, in contrast, according to some exemplary embodiments, different time delays are available, a time delay which is twice as long in comparison with the remaining bits can be selected for the MSB, with the result that the method can be run through more quickly.

Single-pole implementations were described in the above exemplary embodiments. However, implementations with differential or pseudo-differential signals are likewise possible.

The methods and apparatuses described here may be used, for example, in analog/digital converters for fields of use which require high conversion speed and/or low power, for example in radar or lidar (light detection and ranging) applications. With exemplary embodiments of the described methods and apparatuses, it may be possible to determine optimized delay values and/or initial configurations for different operating conditions, for example temperature and voltage, and/or to adapt delay values and/or initial configurations to different operating conditions.

Even though specific exemplary embodiments have been illustrated and described in this description, persons with conventional knowledge in the art will recognize that a multiplicity of alternative and/or equivalent implementations can be selected as a substitute for the specific exemplary embodiments shown and described in this description without departing from the scope of the invention shown. The intention is for this application to cover all adaptations or variations of the specific exemplary embodiments discussed here. Therefore, the intention is for this invention to be restricted only by the claims and the equivalents of the claims.

At least some embodiments are defined by the examples cited below:

Example 1: A method for determining the suitability of a test delay value between comparator decisions of a comparator circuit of an asynchronous successive approximation analog/digital converter, wherein the method comprises: providing the test delay value; converting a predetermined digital test value into an analog test signal by means of the digital/analog converter, approximating the analog test signal in a bit-by-bit manner by means of the asynchronous successive approximation analog/digital converter, thus generating a digital test result, determining whether the test delay value is a suitable delay value for operating the asynchronous successive approximation analog/digital converter on the basis of a comparison of the digital test result with the predetermined digital test value.

Example 2: A method for determining an optimized delay value of a comparator of an asynchronous successive approximation analog/digital converter, comprising: carrying out the method as claimed in claim 1 for at least two different test delay values, determining the optimized delay value on the basis of a comparison of the at least two results of the process of determining whether the test delay value is a suitable delay value for operating the analog/digital converter.

Example 3: The method according to example 2, wherein the at least two test delay values are generated successively and in a monotonously increasing manner, and the method comprises a termination condition, wherein the termination condition is satisfied as soon as the determination determines a suitability, wherein the test delay value which resulted in the termination condition being achieved is determined as the optimized delay value.

Example 4: The method according to example 2, wherein the at least two test delay values are generated by means of an interval interleaving method.

Example 5: The method according to example 4, wherein the interval interleaving method comprises a binary search.

Example 6: The method according to one of the preceding examples, wherein the comparison takes into account redundancy areas of the asynchronous successive approximation analog/digital converter.

Example 7: The method according to one of examples 2-5, wherein optimized delay values are determined for at least two different bits and a global delay value is determined as the maximum of the at least two different optimized delay values.

Example 8: The method according to one of examples 2-6, wherein optimized delay values are determined for at least three different bits and at least two selected delay values are selected from the three optimized delay values, wherein one of at least two selected delay values is assigned to each bit.

Example 9: The method according to example 8, wherein an optimized delay value is determined for each of the bits.

Example 10: An apparatus for successive approximation analog/digital conversion, comprising a digital/analog converter, an approximation register, a delay circuit and a time calibration circuit, wherein the time calibration circuit is set up to carry out a method according to examples 1-9.

Example 11: An apparatus for analog/digital conversion, comprising: an asynchronous successive approximation analog/digital converter comprising: a digital/analog converter, an approximation register, a comparator circuit, an adjustable delay circuit, which is set up to stipulate a delay between decisions of the comparator circuit, and a time calibration circuit which is set up to set the delay of the adjustable delay circuit.

Example 12: The apparatus according to example 11, wherein the time calibration circuit is set up to provide the asynchronous successive approximation analog/digital converter with at least one predetermined digital test value and at least one test delay value and to set a delay of the delay circuit to a test delay value, wherein the asynchronous successive approximation analog/digital converter is set up to receive the predetermined digital test value and to convert it into an analog test signal by means of the digital/analog converter, and to approximate the analog test signal in a bit-by-bit manner on the basis of a multiplicity of comparator decisions in order to provide a digital test result, wherein the time calibration circuit is additionally set up to receive the digital test result and to determine a suitability of the at least one test delay value on the basis of a comparison of the at least one predetermined digital test value with the digital test result.

Example 13: The apparatus according to example 12, wherein the digital/analog converter comprises a capacitive arrangement, and the received predetermined digital test value is converted into the analog test signal by setting the capacitive arrangement in a redistribution phase or in a sampling phase of the analog/digital converter according to the digital test value.

Example 14: The apparatus according to example 12 or 13, wherein the time calibration circuit is additionally set up to determine an optimized delay value on the basis of the comparison of a plurality of comparator results for at least two different test delay values.

Example 15: The apparatus according to example 12 or 13, wherein the apparatus is set up to carry out a method according to one of examples 2-9.

Example 16: The apparatus according to one of the preceding examples, wherein the delay circuit has at least two different delay values and is set up to provide these values in response to a comparator decision.

The exemplary embodiments illustrated are used only for illustration and should not be interpreted as restrictive.

What is claimed is:

1. A method for determining a suitability of a test delay value between comparator decisions of a comparator circuit of an asynchronous successive approximation analog/digital converter, wherein the asynchronous successive approximation analog/digital converter comprises a digital/analog converter, the method comprising:
providing the test delay value;
converting a predetermined digital test value into an analog test signal using the digital/analog converter;
approximating the analog test signal in a bit-by-bit manner using the asynchronous successive approximation analog/digital converter, and generating a digital test result based on the approximating; and
determining whether the test delay value is a suitable delay value for operating the asynchronous successive approximation analog/digital converter, determining comprising comparing the digital test result with the predetermined digital test value.

2. The method as claimed in claim 1, wherein the comparing the digital test result takes into account redundancy areas of the asynchronous successive approximation analog/digital converter.

3. A method for determining an optimized delay value of a comparator circuit of an asynchronous successive approximation analog/digital converter comprising a digital/analog converter and the comparator circuit, the method comprising:
determining a suitability of at least two test delay values between comparator decisions of the comparator circuit of the asynchronous successive approximation analog/digital converter, wherein for each of the at least two test delay values, determining the suitability comprises performing the following steps to produce at least two corresponding digital test results:
providing a respective test delay value of the at least two test delay values;
converting a predetermined digital test value into an analog test signal using the digital/analog converter,
approximating the analog test signal in a bit-by-bit manner using the asynchronous successive approximation analog/digital converter, and generating a corresponding digital test result of the at least two corresponding digital test results based on the approximating, determining whether the respective test delay value is a suitable delay value for operating the asynchronous successive approximation analog/digital converter, determining comprising comparing the corresponding digital test result with the predetermined digital test value; and determining the optimized delay value comprising comparing the at least two corresponding digital test results.

4. The method as claimed in claim 3, wherein:
the at least two test delay values are generated successively and in a monotonously increasing manner;
the method further comprises determining that a termination condition is satisfied when the respective test delay value is determined to be the suitable delay value; and
the respective test delay value that resulted in the termination condition being achieved is determined to be the optimized delay value.

5. The method as claimed in claim 3, wherein the at least two test delay values are generated using an interval interleaving method.

6. The method as claimed in claim 5, wherein the interval interleaving method comprises a binary search.

7. The method as claimed in claim 3, wherein optimized delay values are determined for at least two different bits and a global delay value is determined as the maximum of the at least two different optimized delay values.

8. The method as claimed in claim 3, wherein optimized delay values are determined for at least three different bits and at least two selected delay values are selected from three optimized delay values, wherein one of at least two selected delay values is assigned to each bit produced by the successive approximation analog/digital converter.

9. The method as claimed in claim 8, wherein an optimized delay value is determined for each bit produced by the successive approximation analog/digital converter.

10. An apparatus for successive approximation analog/digital conversion, the apparatus comprising:
a digital/analog converter;
an asynchronous approximation register;
a delay circuit; and
a time calibration circuit, wherein the time calibration circuit is configured to:
provide a test delay value,
convert a predetermined digital test value into an analog test signal using the digital/analog converter,
approximate the analog test signal in a bit-by-bit manner using digital/analog converter and the asynchronous approximation register, and generating a digital test result based on the approximating, and
determine whether the test delay value is a suitable delay value for performing the successive approximation analog/digital conversion, determining comprising comparing the digital test result with the predetermined digital test value.

11. An apparatus for analog/digital conversion, the apparatus comprising:
an asynchronous successive approximation analog/digital converter comprising:
a digital/analog converter,
an approximation register,
a comparator circuit,
an adjustable delay circuit configured to stipulate a delay between decisions of the comparator circuit, and
a time calibration circuit;
wherein the asynchronous successive approximation analog/digital converter is configured to:
receive a predetermined digital test value and to convert the predetermined digital test value into an analog test signal using the digital/analog converter, and
approximate the analog test signal in a bit-by-bit manner on based on a multiplicity of comparator decisions to provide a digital test result; and
wherein the time calibration circuit is configured to compare the digital test result with the predetermined digital test value and to determine a suitability of at least one test delay value based on comparing the predetermined digital test value with the digital test result.

12. The apparatus as claimed in claim 11, wherein the time calibration circuit configured to:
provide the asynchronous successive approximation analog/digital converter with the predetermined digital test value and the at least one test delay value; and
set the delay of the delay circuit.

13. The apparatus as claimed in claim 11, wherein the digital/analog converter comprises a capacitive arrangement, and the received predetermined digital test value is converted into the analog test signal by setting the capacitive arrangement in a redistribution phase or in a sampling phase of the analog/digital converter according to the digital test value.

14. The apparatus as claimed in claim 11, wherein the time calibration circuit is further configured to determine an optimized delay value based on comparing a plurality of comparator results for at least two different test delay values.

15. The apparatus as claimed in claim 14, wherein the at least two different test delay values are generated using an interval interleaving method.

16. The apparatus as claimed in claim 15, wherein the interval interleaving method comprises a binary search.

17. The apparatus as claimed in claim 11, wherein the delay circuit has at least two different delay values and is set up to provide these values in response to a decision by the comparator circuit.

18. The apparatus as claimed in claim 11, wherein the apparatus is configured to determine an optimized delay value by comparing two digital test results.

19. The apparatus as claimed in claim 17, wherein an optimized delay value is determined for each bit produced by the successive approximation analog/digital converter.

20. The apparatus as claimed in claim 11, wherein comparing the predetermined digital test value with the digital test result takes into account redundancy areas of the asynchronous successive approximation analog/digital converter.

* * * * *